United States Patent
Han

(10) Patent No.: US 10,276,257 B2
(45) Date of Patent: Apr. 30, 2019

(54) SEMICONDUCTOR DEVICE AND SYSTEM RELATING TO THE REDUCTION OF TEST TIME IN A RING OSCILLATOR BURN-IN TEST

(71) Applicant: SK hynix Inc., Icheon-si, Gyeonggi-do (KR)

(72) Inventor: Min Sik Han, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/612,003

(22) Filed: Jun. 2, 2017

(65) Prior Publication Data

US 2018/0166146 A1 Jun. 14, 2018

(30) Foreign Application Priority Data

Dec. 12, 2016 (KR) ........................ 10-2016-0168812

(51) Int. Cl.
| G11C 29/12 | (2006.01) |
| G11C 5/14 | (2006.01) |
| G01R 31/28 | (2006.01) |
| G11C 29/06 | (2006.01) |
| H03K 3/03 | (2006.01) |

(52) U.S. Cl.
CPC .......... *G11C 29/12* (2013.01); *G01R 31/2851* (2013.01); *G11C 5/14* (2013.01); *G11C 29/06* (2013.01); *G11C 29/12005* (2013.01); *G11C 5/147* (2013.01); *H03K 3/0315* (2013.01)

(58) Field of Classification Search
CPC ........... G11C 29/12; G11C 5/14; G11C 29/06; G11C 29/12005; G11C 5/147; H03B 5/1221; G01R 31/2851

USPC .......................................................... 365/201
See application file for complete search history.

(56) References Cited

U.S. PATENT DOCUMENTS

| 9,857,409 B2* | 1/2018 | Kawa ................. G01R 31/2621 |
| 2005/0134394 A1* | 6/2005 | Liu .................. G01R 31/31703 331/57 |
| 2005/0140418 A1* | 6/2005 | Muniandy ................. G06F 1/04 327/291 |
| 2007/0183214 A1* | 8/2007 | Yoshinaga ............. G11C 29/12 365/185.23 |
| 2008/0084228 A1 | 4/2008 | Liu et al. |
| 2008/0094053 A1* | 4/2008 | Han ................. G01R 31/31727 324/76.39 |
| 2009/0189703 A1* | 7/2009 | Chuang ................ H03K 3/0315 331/57 |
| 2012/0146672 A1* | 6/2012 | Winter ................... G11C 5/147 324/750.3 |

(Continued)

FOREIGN PATENT DOCUMENTS

| KR | 1020150013738 A | 2/2015 |
| WO | 2013168168 A1 | 11/2013 |

*Primary Examiner* — Sung Il Cho
(74) *Attorney, Agent, or Firm* — William Park & Associates Ltd.

(57) ABSTRACT

A semiconductor device may be provided. The semiconductor device may include a first oscillation signal generation circuit for generating a first oscillation signal. The semiconductor device may include a second oscillation signal generation circuit for generating a second oscillation signal. The second oscillation signal generation circuit may be provided with a test voltage. The test voltage may be generated based on a burn-in test signal.

13 Claims, 11 Drawing Sheets

(56) References Cited

U.S. PATENT DOCUMENTS

| | | | |
|---|---|---|---|
| 2013/0015876 A1* | 1/2013 | Lai | G01R 31/31924 324/762.01 |
| 2015/0127077 A1 | 5/2015 | Asher et al. | |
| 2017/0187358 A1* | 6/2017 | Takeuchi | H03K 3/011 |

* cited by examiner

SEMICONDUCTOR DEVICE AND SYSTEM RELATING TO THE REDUCTION OF TEST TIME IN A RING OSCILLATOR BURN-IN TEST

CROSS-REFERENCE TO RELATED APPLICATION

This application claims priority based upon Korean patent application No. 10-2016-0168812, filed on Dec. 12, 2016, the disclosure of which is hereby incorporated in its entirety by reference herein.

BACKGROUND

1. Technical Field

Embodiments of the present disclosure may generally relate to a semiconductor device and a semiconductor system, and a method for controlling the semiconductor device, and more particularly to a technology relating to the reduction a test time of the semiconductor device.

2. Related Art

A burn-in test is a test method for applying severe conditions (for example, a high temperature and a high pressure) to a semiconductor device for long periods of time. Using these testing methods may enhance or guarantee the reliability of the semiconductor device.

In order to measure the degree of degradation of the burn-in tested semiconductor device, characteristics of the semiconductor device, for example, a current (Ids) or a threshold voltage of each transistor contained in the semiconductor device, may be first measured prior to execution of the burn-in test. Additionally, the above-mentioned characteristics may be re-measured after completion of the burn-in test, such that first measurement characteristics may be compared with second measurement characteristics.

However, since the above-mentioned scheme must perform such measurement two times before or after completion of the burn-in test, the entire test execution time may increase, resulting in increased production costs of the semiconductor device during a fabrication process.

SUMMARY

In accordance with an embodiment of the present disclosure, a semiconductor system may be provided. In accordance with an embodiment of the present disclosure, a semiconductor device may be provided. The semiconductor device may include a first oscillation signal generation circuit for generating a first oscillation signal. The semiconductor device may include a second oscillation signal generation circuit for generating a second oscillation signal. The second oscillation signal generation circuit may be provided with a test voltage. The test voltage may be generated based on a burn-in test signal.

In accordance with an embodiment of the present disclosure, a semiconductor device may be provided. The semiconductor may include: a voltage generation circuit configured to generate a test voltage on the basis of a burn-in test signal; a first oscillation signal generation circuit configured to receive a first oscillation enable signal and generate a first oscillation signal, wherein the first oscillation signal is either fixed to a specific level or oscillated based on the first oscillation enable signal; a second oscillation signal generation circuit configured to receive a second oscillation enable signal and the test voltage and generate a second oscillation signal; and a degradation detection circuit configured to generate an oscillation count signal on the basis of the first oscillation signal and the second oscillation signal.

The voltage generation circuit may be configured to generate the test voltage having a ground voltage level when the burn-in test signal is enabled.

When the burn-in test signal is enabled, degradation of the second oscillation signal generation circuit may be less than degradation of the first oscillation signal generation circuit.

In accordance with an embodiment of the present disclosure, a semiconductor device may be provided. The semiconductor device may include: a voltage generation circuit configured to generate a test voltage on the basis of a burn-in test signal; a first oscillation signal generation circuit configured to receive a first oscillation enable signal and generate a first oscillation signal; and a second oscillation signal generation circuit configured to receive the test voltage and generate a second oscillation signal, wherein, when the burn-in test signal is enabled, degradation of the second oscillation signal generation circuit is less than degradation of the first oscillation signal generation circuit.

The voltage generation circuit may be configured to generate the test voltage having a ground voltage level when the burn-in test signal is enabled.

The first oscillation signal may be either fixed to a specific level or oscillating based on the first oscillation enable signal.

The semiconductor device may further include: a degradation detection circuit configured to generate an oscillation count signal on the basis of the first oscillation signal and the second oscillation signal.

The first oscillation signal generation circuit may include at least one transistor configured to receive the test voltage.

The first oscillation signal generation circuit may include at least one inverter having a first PMOS transistor coupled to a first NMOS transistor.

The second oscillation signal generation circuit may include at least one inverter having a second PMOS transistor and a second NMOS transistor, and the second oscillation signal generation circuit may receive the test voltage through a source terminal of the second PMOS transistor.

Figure 1:
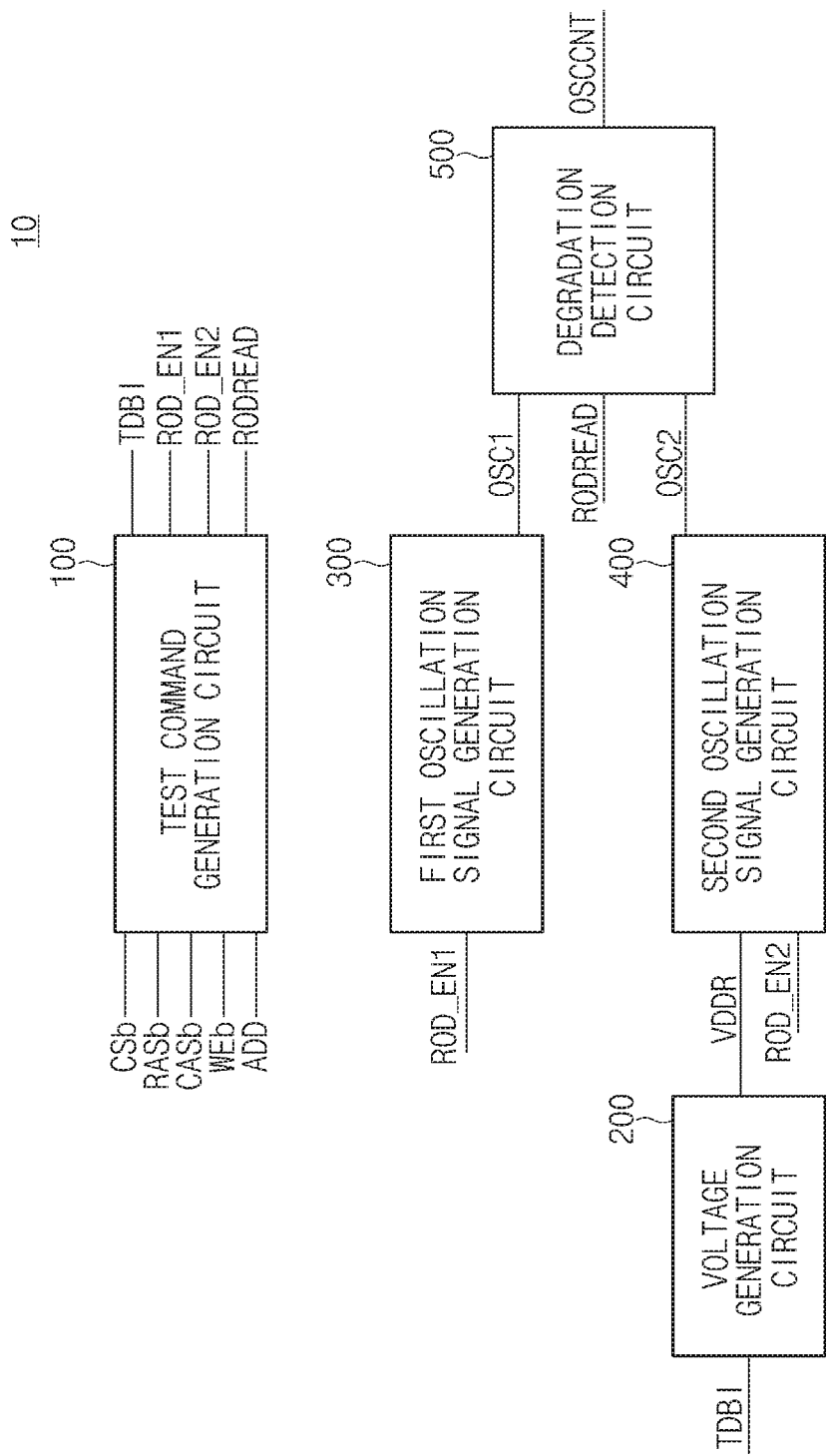
FIG. 1 is a block diagram illustrating a representation of an example of a semiconductor device according to an embodiment of the present disclosure.
Figure 5:
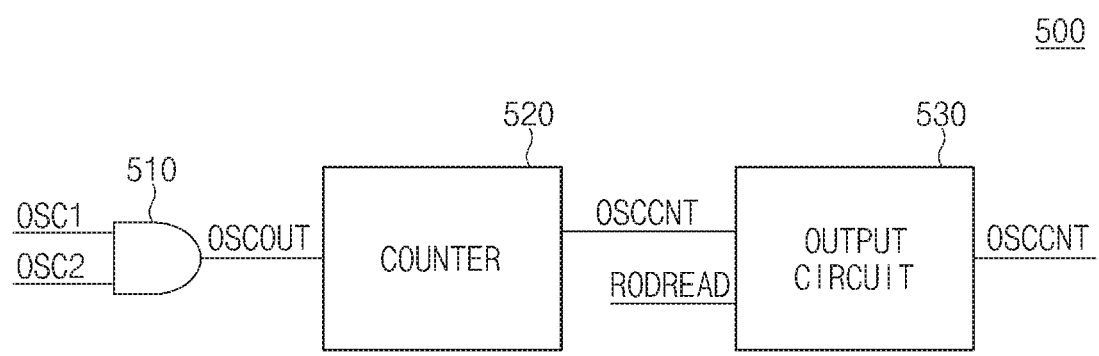

FIG. 5 is a block diagram illustrating a representation of an example of a degradation detection circuit illustrated in FIG. 1.

Figure 6:
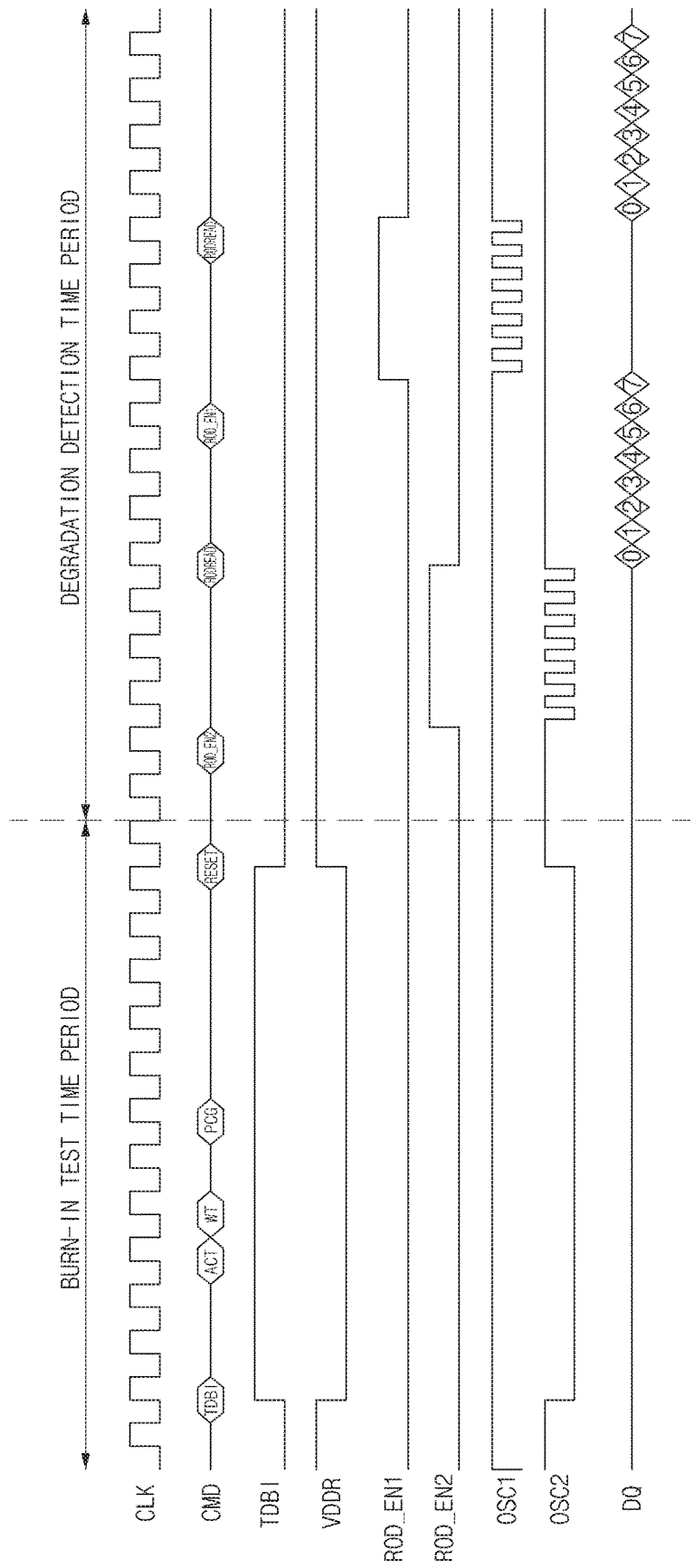

FIG. 6 is a timing diagram illustrating a representation of an example of respective signals for use in the semiconductor device illustrated in FIG. 1.

Figure 7:
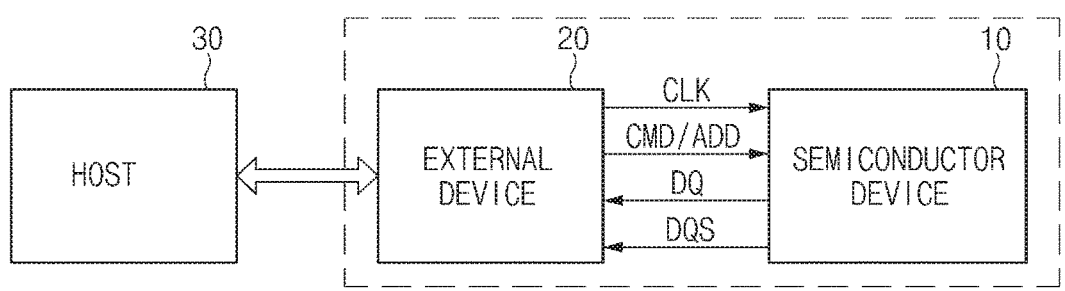

FIG. 7 is a block diagram illustrating a representation of an example of a semiconductor system including a semiconductor device illustrated in FIG. 1 according to an embodiment of the present disclosure.

DETAILED DESCRIPTION

Reference will now be made to the embodiments of the present disclosure, examples of which are illustrated in the accompanying drawings. Wherever possible, the same reference numbers will be used throughout the drawings to refer to the same or like parts.

Various embodiments of the present disclosure may be directed to providing a semiconductor device and a semiconductor system including the same that substantially obviate one or more problems due to limitations and disadvantages of the related art.

Embodiments of the present disclosure may relate to a semiconductor device and a semiconductor system which can measure degradation of semiconductor elements by measuring characteristics of the semiconductor device after completion of the burn-in test, resulting in perhaps the reduction of the entire test execution time.

Further, the logic levels of the signals may be different from or the opposite of those described. For example, a signal described as having a logic "high" level may alternatively have a logic "low" level, and a signal described as having a logic "low" level may alternatively have a logic "high" level.

For reference, an embodiment including additional components may be provided. Furthermore, an active high or active low configuration indicating an active state of a signal or circuit may be changed depending on embodiments. Furthermore, the configuration of a transistor required for implementing the same function may be modified. That is, the configuration of the PMOS transistor and the configuration of the NMOS transistor may be replaced with each other, depending on a specific situation. If necessary, various transistors may be applied to implement the configurations.

For reference, an embodiment including additional components may be provided. Furthermore, an active high or active low configuration indicating an active state of a signal or circuit may be changed depending on embodiments. Furthermore, the configuration of a logic gate or logic gates required for implementing the same function or operation may be modified. That is, the logic gate configuration of one type of operation and another logic gate configuration for the same type of operation may be replaced with each other, depending on a specific situation. If necessary, various logic gates may be applied to implement the configurations.

FIG. 1 is a block diagram illustrating a representation of an example of a semiconductor device 10 according to an embodiment of the present disclosure.

Referring to FIG. 1, the semiconductor device 10 may include a test command generation circuit 100, a voltage generation circuit 200, a first oscillation signal generation circuit 300, a second oscillation signal generation circuit 400, and a degradation detection circuit 500. The semiconductor device 10 may be a memory device such as a DRAM or flash memory, or may be a non-memory device.

The test command generation circuit 100 may generate a burn-in test signal TDBI, a first oscillation enable signal ROD_EN1, a second oscillation enable signal ROD_EN2, or an oscillation output signal RODREAD on the basis of a control signal received from an external device 20 (see FIG. 7). For example, the external device may be a memory controller or an application processor capable of controlling the semiconductor device 10. The control signal may be at least one of a chip selection signal CSb, a row address strobe signal RASb, a column address strobe signal CASb, a write enable signal WEb, and an address signal ADD.

The test command generation circuit may enable the burn-in test signal TDBI, the first oscillation enable signal ROD_EN1, the second oscillation enable signal ROD_EN2, or the oscillation output signal RODREAD according to a combination value of the at least one control signal. The burn-in test signal TDBI may be applied to the semiconductor device 10 during the burn-in test of the semiconductor device 10. The first oscillation enable signal ROD_EN1 and the second oscillation enable signal ROD_EN2 may respectively operate the first oscillation generation circuit 300 and the second oscillation signal generation circuit 400. The oscillation output signal RODREAD may be used to output an oscillation count signal OSCCNT.

The voltage generation circuit 200 may generate a test voltage VDDR supplied to the second oscillation signal generation circuit 400 in response to the burn-in test signal TDBI. For example, the voltage generation circuit 200 may allow the test voltage VDDR to be a ground voltage (VSS) level when the burn-in test signal TDBI is enabled. If the burn-in test signal TDBI is disabled, the voltage generation circuit 200 may allow the test voltage VDDR to be a power-supply voltage (VDD) level.

The first oscillation signal generation circuit 300 may generate a first oscillation signal OSC1 in response to the first oscillation enable signal ROD_EN1. During the burn-in test, the first oscillation enable signal may be disabled, such that the first oscillation signal OSC1 indicating an output signal of the first oscillation signal generation circuit 300 and an internal signal of the first oscillation signal generation circuit 300 may be fixed to a specific level. As a result, Negative Bias Temperature Instability (NBTI) degradation may occur in at least some PMOS transistors contained in the first oscillation signal generation circuit 300.

Alternatively, the first oscillation enable signal ROD_EN1 may be enabled during the burn-in test, such that not only the first oscillation signal OSC1 indicating the output signal of the first oscillation signal generation circuit 300 but also the internal signal may oscillate. As a result, Hot Carrier Injection (HCI) degradation may occur in at least some PMOS transistors contained in the first oscillation signal generation circuit 300.

That is, for example, degradation (for example, NBTI or HCI degradation) may occur in the first oscillation signal generation circuit during the burn-in test.

The second oscillation signal generation circuit 400 may generate a second oscillation signal OSC2 in response to the second oscillation enable signal ROD_EN2. The second oscillation signal generation circuit 400 is needed for comparison with the first oscillation signal generation circuit 300, and may be identical in structure to the first oscillation signal generation circuit 300. However, a test voltage VDDR generated from the voltage generation circuit 200 may be supplied to a power-supply voltage of the second oscillation signal generation circuit 400. Therefore, a ground voltage may be supplied to the power-supply voltage terminal of the second oscillation signal generation circuit 400 during the burn-in test. In this case, since a ground voltage is supplied to a source terminal of each PMOS transistor contained in the second oscillation signal generation circuit 400, degradation of the second oscillation signal generation circuit 400 may be minimized during the burn-in test.

The degradation detection circuit 500 may generate an oscillation count signal OSCCNT on the basis of the first oscillation signal OSC1 and the second oscillation signal OSC2. The first oscillation signal OSC1 and the second oscillation signal OSC2 may be generated after completion of the burn-in test. The degradation detection circuit 500 may count the number of oscillations of the first oscillation signal OSC1 and the number of oscillations of the second oscillation signal OSC2, such that the degradation detection circuit 500 may generate the oscillation count signal OSC-CNT. The degradation detection circuit 500 may output the oscillation count signal OSCCNT in response to the oscillation output signal RODREAD.

Figure 2A:
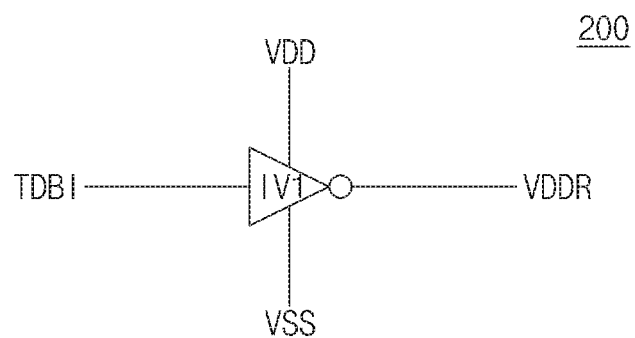
FIG. 2A is a view illustrating a representation of an example of a voltage generation circuit illustrated in FIG. 1.

FIG. 2A is a view illustrating a representation of an example of the voltage generation circuit 200 illustrated in FIG. 1.

As described above, the voltage generation circuit 200 may generate a test voltage VDDR on the basis of the burn-in test signal TDBI. For example, when the burn-in test signal TDBI is enabled, the voltage generation circuit 200 may generate a test voltage VDDR having the ground voltage (VSS) level. When the burn-in test signal TDBI is disabled, the voltage generation circuit 200 may generate the test voltage VDDR having a power-supply voltage (VDD) level.

Referring to FIG. 2A, the voltage generation circuit 200 may be implemented as an inverter IV1. Therefore, when the burn-in test signal is enabled to a high level, the voltage generation circuit 200 may generate a low-level test voltage VDDR. When the burn-in test signal is disabled to a low level, the voltage generation circuit 200 may generate a high-level test voltage VDDR.

Figure 2B:
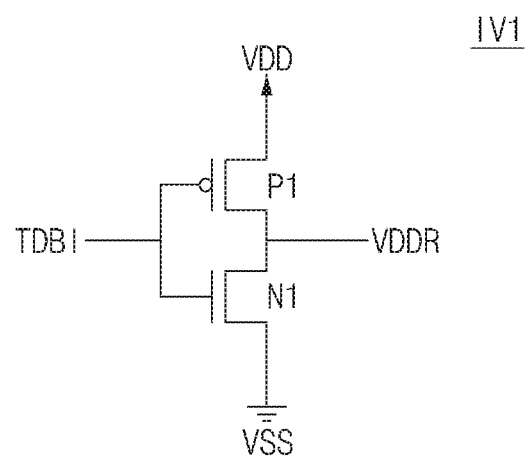
FIG. 2B is a view illustrating a representation of an example of an inverter illustrated in FIG. 2A.

FIG. 2B is a view illustrating a representation of an example of the inverter IV1 illustrated in FIG. 2A.

Referring to FIG. 2B, the inverter IV1 may include a PMOS transistor P1 and an NMOS transistor N1. A source terminal of the PMOS transistor P1 may be coupled to a power-supply voltage (VDD) terminal, and a source terminal of the NMOS transistor N1 may be coupled to a ground voltage (VSS) terminal. A drain terminal of the PMOS transistor P1 may be coupled to a drain terminal of the NMOS transistor N1. Each of the drain terminal of the PMOS transistor P1 and the drain terminal of the NMOS transistor N1 may have a test voltage. A burn-in test signal TDBI may be applied to a common gate terminal of the PMOS transistor P1 and the NMOS transistor N1.

If the burn-in test signal TDBI is enabled to a high level, the NMOS transistor N1 constructing the inverter IV1 may be turned on and the PMOS transistor P1 may be turned off. That is, the inverter IV2 may be pulled down such that the test voltage VDDR may reach the ground voltage (VSS) level. If the burn-in test signal TDBI is disabled to a low level, the PMOS transistor P1 constructing the inverter may be turned on and the NMOS transistor N1 may be turned off. That is, the inverter IV1 is pulled up such that the test voltage VDDR may reach the power-supply voltage (VDD) level.

In other words, the voltage generation circuit 200 may supply the ground voltage (VSS) level to the second oscillation signal generation circuit 400 during the burn-in test, such that stress applied to the second oscillation signal generation circuit 400 can be minimized. In a stage for detecting the degree of degradation after completion of the burn-in test, the power-supply voltage (VDD) level is supplied to the second oscillation signal generation circuit 400 to operate the second oscillation signal generation circuit 400, such that the second oscillation signal generation circuit 400 can output the second oscillation signal OSC2.

Figure 3A:
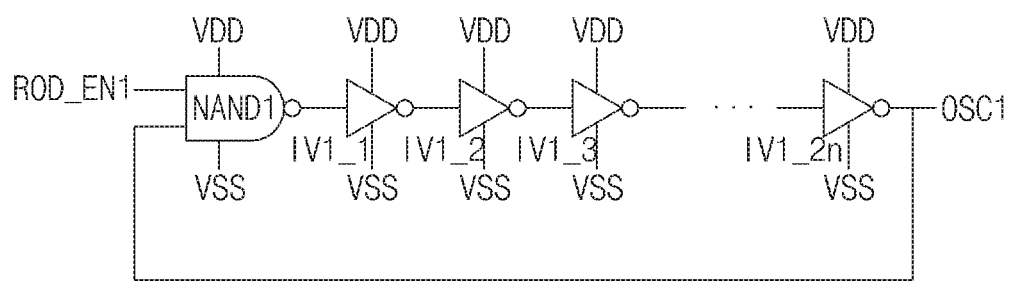
FIG. 3A is a view illustrating a representation of an example of a first oscillation signal generation circuit.

FIG. 3A is a view illustrating a representation of an example of the first oscillation signal generation circuit 300.

The first oscillation signal generation circuit 300 may be contained in the semiconductor device 10 to measure the degree of degradation of the semiconductor device 10.

Referring to FIG. 3A, the first oscillation signal generation circuit 300 may be a ring oscillator. For example, the first oscillation signal generation circuit 300 may include a NAND gate NAND1 configured to perform a logic NAND operation between the first oscillation enable signal ROD_EN1 and the first oscillation signal OSC1, and an even number of inverters IV1_1~IV1_2n connected in a ring shape to the NAND gate NAND1.

The first oscillation signal generation circuit 300 may generate the first oscillation signal OSC1 toggled between a high level and a low level, when the first oscillation enable signal ROD_EN1 is enabled.

For example, assuming that the first oscillation signal OSC1 is at a low level when the first oscillation enable signal ROD_EN1 is enabled to a high level, an output signal of the NAND gate NAND1 may reach a high level. Therefore, the output signal of the inverter IV1_1 configured to receive the output signal of the NAND gate NAND1 becomes at a low level. The output signal of the inverter IV1_2 becomes at a high level, and the output signal of the inverter IV1_3 becomes at a low level. That is, the output signals of the odd inverters (IV1_1, IV1_3 . . . ) become at a low level, and the output signals of the even inverters (IV1_2 . . . ) become at a high level. The last inverter IV1_2n is an even inverter, such that the output signal of the inverter IV1_2n (i.e., the first oscillation signal OSC1) becomes at a high level. Accordingly, the first oscillation signal OSC1 may transition from a low level to a high level.

The first oscillation signal OSC1 having a logic high level may be re-input to the NAND gate NAND1. Since the first oscillation enable signal ROD_EN1 is at a high level, the output signal of the NAND gate NAND1 becomes at a low level. Therefore, the output signal of the inverter IV1_1 becomes at a high level, the output signal of the inverter IV1_2 becomes at a low level, and the output signal of the inverter IV1_3 becomes at a high level. In other words, if the first oscillation signal OSC1 having a logic high level is re-input to the NAND gate NAND1, the output signal of the odd inverter (IV1_1, IV1_3 . . . ) becomes at a high level, and the output signal of the even inverter (IV1_2 . . . ) becomes at a low level. Accordingly, the output signal (i.e., the first oscillation signal OSC1) of the last even inverter IV1_2n may be at a low level.

The first oscillation signal OSC1 having a low level is re-input to the NAND gate NAND1, such that the first oscillation signal OSC1 having a high level is output. That is, when the first oscillation enable signal ROD_EN1 is enabled, the first oscillation signal generation circuit 300 may generate the first oscillation signal OSC1 toggled between the high level and the low level.

If the first oscillation enable signal ROD_EN1 is disabled, the first oscillation signal generation circuit 300 may generate the first oscillation signal OSC1 having a fixed level.

In this case, each of the output signals of the NAND gate NAND1 and the inverters IV1_1~IV1_2n may have a fixed level.

Figure 3B:
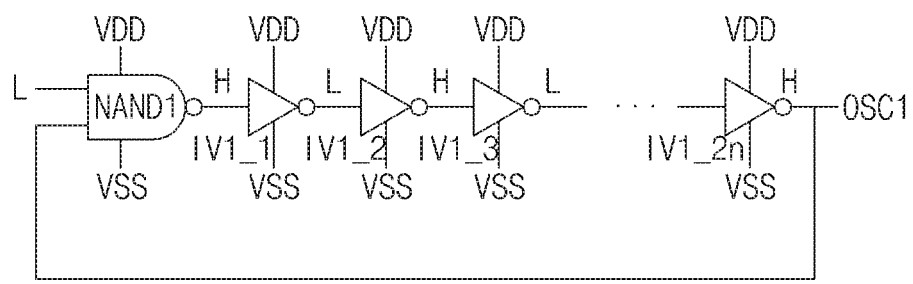
FIG. 3B is a view illustrating a representation of an example of levels of signals generated in the first oscillation signal generation circuit when a first oscillation enable signal.

FIG. 3B is a view illustrating signal levels of I/O terminals of the NAND gate NAND1 and the inverters IV1_1~IV1_2n of the first oscillation enable generation circuit 300, when the first oscillation enable signal ROD_EN1 is disabled.

Referring to FIG. 3B, since the first oscillation enable signal ROD_EN1 is at a low level (L), the output signal of the NAND gate NAND1 becomes at a high level (H). The output signal of the inverter IV1_1 becomes at a low level, the output signal of the inverter IV1_2 becomes at a high level, and the output signal of the inverter IV1_3 becomes at a low level. In other words, the output signal of the odd inverter (IV1_1, IV1_3 . . . ) becomes at a low level, and the output signal of the even inverter (IV1_2 . . . ) becomes at a high level. Accordingly, the output signal (i.e., the first oscillation signal OSC1) of the last even inverter IV1_2n may be at a high level.

The first oscillation signal OSC1 having a high level is re-input to the NAND gate NAND1. In this case, since the first oscillation enable signal ROD_EN1 is at a low level, the output signal of the NAND gate NAND1 may remain at a high level. Accordingly, the output signals of the inverters IV1_1~IV1_2n may also remain at a previous level.

State information of the NAND gate NAND1 of the first oscillation signal generation circuit 300 will hereinafter be described with reference to FIG. 3C.

Figure 3C:
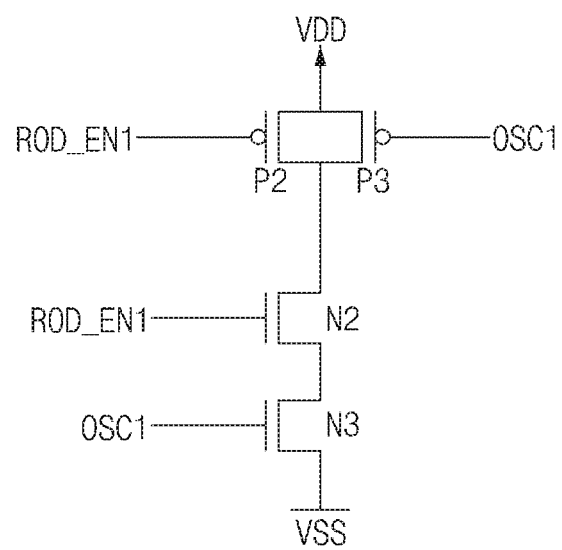
FIG. 3C is a view illustrating a representation of an example of a NAND gate illustrated in FIG. 3A.

FIG. 3C is a view illustrating a representation of an example of the NAND gate NAND1 illustrated in FIG. 3A.

Referring to FIG. 3C, the NAND gate NAND1 may include two PMOS transistors P2 and P3 in which source terminals are coupled to the power-supply voltage VDD terminal and drain terminals are commonly coupled; an NMOS transistor N2, a drain terminal of which is coupled to a common drain terminal of the PMOS transistors P2 and P3; and an NMOS transistor N3, a drain terminal of which is coupled to a source terminal of the NMOS transistor N2 in a manner that the source terminal of the NMOS transistor N3 is coupled to the ground voltage VSS terminal. The first oscillation enable signal ROD_EN1 may be input to gate terminals of the PMOS transistor P2 and the NMOS transistor N2, and the first oscillation signal OSC1 may be input to gate terminals of the PMOS transistor P3 and the NMOS transistor N3.

In the above-mentioned NAND gate NAND1, referring to FIG. 3C, if the first oscillation enable signal ROD_EN1 having a low level and the first oscillation signal OSC1 having a high level are input to the NAND gate NAND1, the PMOS transistor P2 may be turned on and the PMOS transistor P3 may be turned off. In other words, if the first oscillation enable signal ROD_EN1 is at a low level, the ground voltage VSS is applied to a gate terminal of the PMOS transistor P2, the power-supply voltage VDD is applied to a source terminal of the PMOS transistor P2, the power-supply voltage VDD is applied to a drain terminal of the PMOS transistor P2, such that Negative Bias Temperature Instability (NBTI) degradation may occur in the PMOS transistor P2.

If the first oscillation enable signal ROD_EN1 having a high level is applied to the NAND gate NAND1 illustrated in FIG. 3C, the PMOS transistor P2 may be turned off, and the PMOS transistor P3 may be repeatedly turned on and off according to the first oscillation signal OSC1 being oscillated. Therefore, Hot Carrier Injection (HCI) degradation may occur in the PMOS transistor P3.

State information of the inverters IN1_1~IN1_2n of the first oscillation signal generation circuit 300 will hereinafter be described with reference to FIG. 2B. Although FIG. 2B for example illustrates the voltage generation circuit 200 for convenience of description, the inverters IV1_1~IV1_2n contained in the first oscillation signal generation circuit 300 illustrated in FIG. 3A may also be used without departing from the scope or spirit of the present disclosure.

Referring to FIG. 3B, if the first oscillation enable signal ROD_EN1 is disabled, the output signal of the NAND gate NAND1 becomes at a high level. Therefore, the PMOS transistor P1 of the inverter IV2 having the structure of FIG. 2B is turned off and the NMOS transistor N1 is turned on, such that the output signal of the inverter IV2 becomes at a low level. Since a low level is input to the inverter IV3, the PMOS transistor P2 of the inverter IV3 is turned on and the NMOS transistor N2 is turned off.

In other words, if the first oscillation enable signal ROD_EN1 is disabled, the ground voltage VSS may be applied to a gate terminal of the PMOS transistor P1 contained in the even inverter (IV1_2 . . . ), the power-supply voltage VDD may be applied to a source terminal of the PMOS transistor P1 contained in the even inverter (IV1_2 . . . ), and the power-supply voltage VDD may be applied to a drain terminal of the PMOS transistor P1 contained in the even inverter (IV1_2 . . . ). Therefore, referring to FIG. 3B, NBTI degradation may occur in the PMOS transistor P1 contained in the even inverters (IV1_2 . . . ).

When the first oscillation enable signal ROD_EN1 having a high level is applied to the inverters IV1_1~IV1_2n of the first oscillation signal generation circuit 300 having the structure of FIG. 2B, an oscillation signal may be input to the PMOS transistor P1. Therefore, HCI degradation may occur in the PMOS transistor P1 contained in the inverters IV1_1~IV1_2n of the first oscillation signal generation circuit 300.

In other words, the first oscillation enable signal ROD_EN1 is disabled during the burn-in test, such that NBTI degradation may occur in the first oscillation signal generation circuit 300. In addition, since the first oscillation enable signal ROD_EN1 is enabled during the burn-in test, HCI degradation may occur in the first oscillation signal generation circuit 300.

Figure 4A:
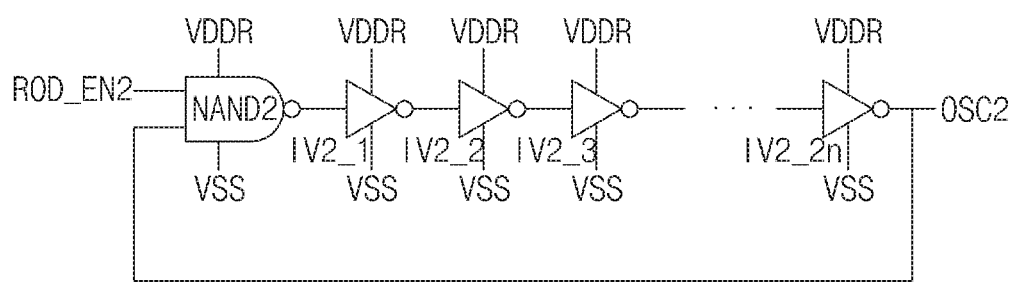
FIG. 4A is a view illustrating a representation of an example of a second oscillation signal generation circuit illustrated in FIG. 1.

FIG. 4A is a view illustrating a representation of an example of the second oscillation signal generation circuit 400 illustrated in FIG. 1.

The second oscillation signal generation circuit 400 may be configured to generate a reference signal for comparison between degradation levels of the first oscillation signal generation circuit 300. In the same manner as in the first oscillation signal generation circuit 300, the second oscillation signal generation circuit 400 may include a NAND gate NAND2 for performing a NAND operation between the second oscillation enable signal ROD_EN2 and the second oscillation signal OSC2, and an even number of inverters IN2_1~IN2_2n coupled in a ring shape to the NAND gate NAND2. That is, the second oscillation signal generation circuit 400 may be identical in structure to the first oscillation signal generation circuit 300, except that the test voltage VDDR instead of the power-supply voltage VDD is applied to the second oscillation signal generation circuit 400. The NAND gate NAND2 of the second oscillation signal generation circuit 400 may have the structure illustrated in FIG. 3C (however, the test voltage VDDR is applied to source terminals of the PMOS transistors P2 and P3). The inverters IV2_1~IV2_2n of the second oscillation signal generation circuit 400 may have the structure illustrated in FIG. 2B (however, the test voltage VDDR is applied to a source terminal of the PMOS transistor P1).

If the burn-in test signal TDBI and the second oscillation enable signal ROD_EN2 are enabled, the operation of the second oscillation signal generation circuit 400 may be identical to that of the first oscillation signal generation circuit 300 when the first oscillation enable signal ROD_EN1 is enabled. That is, the output signals of the NAND gate NAND2 and the inverters IN2_1~IN2_2n may be toggled between a high level and a low level.

The operation of the second oscillation signal generation circuit 400 when the burn-in test signal TDBI is enabled will hereinafter be described with reference to FIG. 4B.

Figure 4B:
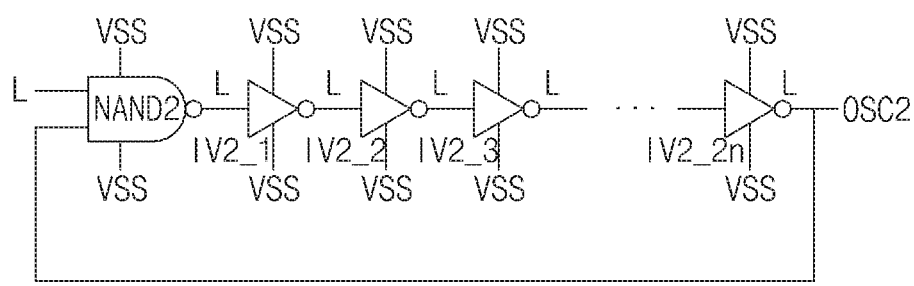
FIG. 4B is a view illustrating a representation of an example of levels of signals of an input and output (input/ output) (I/O) terminal contained in the second oscillation signal generation circuit during a burn-in test.

FIG. 4B is a view illustrating signal levels of I/O terminals of the NAND gate NAND2 and the inverters IV2_1~IV2_2n of the second oscillation signal generation circuit 400 during the burn-in test.

Referring to FIG. 4B, the ground voltage VSS may be supplied to the second oscillation signal generation circuit 400 during the burn-in test. Accordingly, since the NAND gate NAND2 and the inverters IV2_1~IV2_2n are not operated, the output signals of the NAND gate NAND2 and the inverters IV2_1~IV2_2n become a low level.

That is, voltages of source and drain terminals of the PMOS transistors P2, P3, and P1 contained in the NAND gate NAND2 and the inverters IV2_1~IV2_2n become at a ground voltage, such that NBTI degradation or HCI degradation may not occur in the PMOS transistors P2, P3, and P1 contained in the NAND gate NAND2 and the inverters IV2_1~IV2_2n.

The degradation detection circuit 500 configured to detect the degree of degradation of the semiconductor device 10 upon completion of the burn-in test will hereinafter be described with reference to FIG. 5.

FIG. 5 is a block diagram illustrating a representation of an example of the degradation detection circuit 500 illustrated in FIG. 1.

Referring to FIG. 5, the degradation detection circuit 500 may include an AND gate 510 to generate an oscillation center signal OSCOUT by performing an AND operation between the first oscillation signal OSC1 and the second oscillation signal OSC2, a counter 520 to generate an oscillation count signal OSCCNT by counting the oscillation center signal OSCOUT, and an output circuit 530 to output an oscillation count signal OSCCNT in response to the oscillation output signal RODREAD.

The AND gate 510 may perform an AND operation between the first oscillation signal OSC1 generated from the first oscillation signal generation circuit 300 and the second oscillation signal OSC2 generated from the second oscillation signal generation circuit 400. However, in the step of detecting the degree of degradation, the first oscillation enable signal ROD_EN1 for operating the first oscillation signal generation circuit 300 and the second oscillation enable signal ROD_END2 for operating the second oscillation signal generation circuit 400 may be used at different time points. Therefore, when the first oscillation signal OSC1 is applied to the AND gate 510, the second oscillation signal OSC2 is fixed to a high level such that the oscillation center signal OSCOUT may be identical in level to the first oscillation signal OSC1. In addition, the first oscillation signal OSC1 is fixed to a high level when the second oscillation signal OSC2 is applied to the AND gate 510, such that the oscillation center signal OSCOUT may be identical in level to the second oscillation signal OSC2. As a result, the AND gate 510 may be omitted as necessary.

The counter 520 may count the number of oscillations of the oscillation center signal OSCSUM, and may thus generate the oscillation count signal OSCCNT. For example, the counter 520 may be implemented as an 8-bit counter well known to those skilled in the art. In this case, the oscillation counter signal OSCCNT may include, for example but not limited to, 8 bits.

The output circuit 530 may output the oscillation counter signal OSCCNT in response to the oscillation output signal RODREAD. For example, the output circuit 530 may include a serializing circuit (not illustrated) and a DQ driver (not illustrated), and the oscillation output signal RODREAD may be a signal for enabling the DQ driver. If the oscillation output signal RODREAD is enabled, the oscillation counter signal OSCCNT of several bits (e.g., 8 bits) may be serialized by the serializing circuit, and the serialized counter signal OSCCNT may be output through the DQ terminal.

The operation of the degradation detection circuit 500 will hereinafter be described.

If the first oscillation enable signal ROD_EN1 is enabled upon completion of the burn-in test, the first oscillation signal generation circuit 300 may generate the first oscillation signal OSC1. In this case, the second oscillation enable signal ROD_EN2 of the second oscillation signal generation circuit 400 is disabled, such that the second oscillation signal OSC2 may be fixed to a high level. Therefore, the AND gate 510 of the degradation detection circuit 500 may output the oscillation center signal OSCOUT having the same level as the first oscillation signal OSC1. The counter 520 may count the number of oscillations of the oscillation center signal OSCOUT during a predetermined time, and may thus generate the oscillation count signal OSCCNT. Thereafter, when the oscillation output signal RODREAD is enabled, the output circuit 530 may serialize the oscillation output signal and thus output the serialized oscillation output signal to the DQ terminal.

Subsequently, the first oscillation enable signal ROD_EN1 may be disabled and the second oscillation enable signal ROD_EN2 may be enabled. Therefore, the second oscillation signal generation circuit may generate the second oscillation signal OSC2. In this case, the first oscillation enable signal ROD_EN1 of the first oscillation signal generation circuit 300 is disabled, such that the first oscillation signal OSC2 may be fixed to a high level. Therefore, the AND gate 510 of the degradation detection circuit 500 may output the oscillation center signal OSCOUT having the same level as the second oscillation signal OSC2. The counter 520 may count the number of oscillations of the oscillation center signal OSCOUT during the predetermined period of time. Thereafter, if the oscillation output signal is enabled, the output circuit 530 may serialize the oscillation count signal, and may output the serialized oscillation count signal to the DQ terminal.

That is, the degradation detection circuit 500 may sequentially output the number of oscillations of the first oscillation signal generation circuit 300 and the number of oscillations of the second oscillation signal generation circuit 400. Through the result of comparison of the numbers of oscillations, the degradation detection circuit 500 may recognize how much the first oscillation signal generation circuit 300 is degraded compared to the second oscillation signal generation circuit 400.

FIG. 6 is a timing diagram illustrating a representation of an example of respective signals for use in the semiconductor device 10 illustrated in FIG. 1.

Referring to FIG. 6, the operation of the semiconductor device 10 may be classified into a burn-in test time period and a degradation detection time period.

In the initial stage, the burn-in test signal TDBI may be set to a low level, the test voltage VDDR may be set to a high level, the first oscillation enable signal ROD_EN and the second oscillation enable signal ROD_EN may be set to a low level, and the first oscillation signal OSC1 and the second oscillation signal OSC2 may be set to a high level.

If a control signal corresponding to the burn-in test signal TDBI is transferred from the external device to the test command generation circuit 100, the test communication generation circuit 100 may enable the burn-in test signal TDBI to a high level. Therefore, the voltage generation circuit 200 may allow the test voltage VDDR to have the ground voltage (VSS) level. Under this condition, the burn-in test is performed in the semiconductor device 10.

Referring to FIGS. 1, 5, and 6, a command CMD may assume that the semiconductor device 10 is a DRAM. During a predetermined time in which a severe condition is applied to the semiconductor device 10, an active command (ACT), a write command (WT), and a precharge command (PCG) are applied to the semiconductor device 10, such that the semiconductor device 10 can perform the operation (e.g., a write operation) corresponding to the command.

The power-supply voltage VDD is continuously applied to the first oscillation signal generation circuit 300, such that NBTI degradation may occur in the PMOS transistor contained in the first oscillation generation circuit 300 when the first oscillation enable signal is at a low level. In contrast, since the test voltage VDDR has the ground voltage (VSS) level, the second oscillation signal generation circuit 400 may output the second oscillation signal OSC2 having a low level. Minimum NBTI degradation may occur in the second oscillation signal generation circuit 400.

If a reset command is transmitted to the semiconductor device 10 upon completion of the burn-in test, each signal may return to a value corresponding to the initial state.

Subsequently, the second oscillation enable signal ROD_EN2 may be transmitted to the semiconductor device 10 during the degradation detection time period. In this case, the voltage generation circuit 200 may output the test voltage VDDR having a VDD level to the second oscillation signal generation circuit 400. Therefore, the second oscillation signal generation circuit 400 may generate the second oscillation signal OSC2 being oscillated. If the oscillation output signal RODREAD is applied to the degradation detection circuit 500, the degradation detection circuit 500 may output the oscillation count signal OSCCNT acquired by counting the number of oscillations of the second oscillation signal OSC2 through the DQ terminal. The oscillation count signal OSCCNT may be a specific value generated on the basis of the oscillation signal OSC2 generated by the second oscillation signal generation circuit 400 in which NBTI degradation does not occur during the burn-in test, such that the specific value may be used as a comparison reference of the oscillation count signal OSCCNT generated on the basis of the oscillation signal OSC1 generated from the first oscillation signal generation circuit 300.

Subsequently, when the first oscillation enable signal ROD_EN1 is transmitted to the first oscillation signal generation circuit 300, the first oscillation signal generation circuit 300 may generate the first oscillation signal OSC1 being oscillated. If the oscillation output signal RODREAD is applied to the degradation detection circuit 500, the degradation detection circuit 500 may output the oscillation count signal OSCCNT acquired by counting the number of oscillations of the first oscillation signal OSC1 through the DQ terminal. Since NBTI degradation occurs in the burn-in test time period, the first oscillation signal generation circuit 300 may determine the degree of NBTI degradation by the oscillation count signal OSCCNT generated on the basis of the first oscillation signal OSC1.

Although the first oscillation enable signal ROD_EN1 is kept at a low level to cause NBTI degradation during the burn-in test as illustrated in FIG. 6, it should be noted that the first oscillation enable signal ROD_EN1 is set to a high level, such that HCI degradation may also occur. In this case, HCI degradation does not occur in the second oscillation signal generation circuit 400 irrespective of a logic level of the second oscillation enable signal ROD_EN2, such that the second oscillation enable signal ROD_EN2 may have any level without departing from the scope or spirit of the present disclosure.

FIG. 7 is a block diagram illustrating a representation of an example of a semiconductor system 1 including the semiconductor device 10 illustrated in FIG. 1 according to an embodiment of the present disclosure.

Referring to FIG. 7, the semiconductor system 1 may include a semiconductor device 10, an external device 20, and a host 30. For example, the semiconductor device 10 may be a memory device such as, for example but not limited to, a DRAM or flash memory. The external device 20 may be a memory controller configured to control the memory device. The semiconductor device 10 and the external device may also be implemented as a single module. For example, the host 30 may be a Central Processing Unit (CPU), and may be a test device configured to transmit various commands needed to perform a series of operations.

The host 30 may transmit a request and data to the external device 20 to access the semiconductor device 10. The host 30 may transmit data to the external device 20 to store data in the semiconductor device 10. The host 30 may receive data from the semiconductor device 10 through the external device 20. The external device 20 may control the semiconductor device 10 to transmit data, address information, memory setup information, a write request, a read request, etc. to the semiconductor device 10 in response to the request, such that the write or read operation can be performed. The external device 20 may relay communication between the host 30 and the semiconductor device 10. The external device 20 may receive the request and data from the host 30, may generate data DQ, a data strobe DQS, a command CMD, a memory address ADD, a clock CLK, etc. to control the semiconductor device 10, and may transmit the generated result to the semiconductor device 10. The external device 20 may output the data DQ and the data strobe DQS transmitted from the semiconductor device 10 to the host 30.

In an embodiment of the present disclosure, the external device 20 may generate command and address (command/address) signals CMD/ADD in response to a request from the host 30 corresponding to the test device. The command/address signals CMD/ADD may include a chip selection signal CSb illustrated in FIG. 1, a row address strobe signal RASb, a column address strobe signal CASb, and a write enable signal WEb. The test command generation circuit 100 of the semiconductor device 10 may generate test commands on the basis of the command/address signals CMD/ADD, for example, the burn-in test signal TDBI, the first oscillation enable signal ROD_EN1, the second oscillation enable signal ROD_EN2, and the oscillation output signal RODREAD.

The semiconductor device 10 may perform the burn-in test operation and the degradation detection operation on the basis of the above-mentioned test commands. Therefore, the oscillation count signal OSCCNT based on the first oscillation signal generated by the first oscillation signal generation circuit 300 in which degradation occurs and the oscillation count signal OSCCNT based on the second oscillation signal OSC2 generated by the second oscillation signal generation circuit 400 in which no degradation occurs may be output as DQ signals at different time points.

The oscillation count signals OSCCNT may be transmitted to the host 30 through the external device 20. The host 30 may compare the oscillation count signal OSCCNT based on the first oscillation signal OSC1 with the oscillation count signal OSCCNT based on the second oscillation signal OSC2, such that the host 30 can determine the degree of degradation of the semiconductor device 10.

Although FIG. 7 illustrates that the host 30 and the external device 20 are physically separated from each other, the external device 20 may be embedded in a processor of the host 30 (for example, a Central Processing Unit (CPU), an Application Processor (AP), a Graphic Processing Unit (GPU), etc.), or may be configured in the form of a System on Chip (SoC) and be fabricated in one chip along with the processors.

The semiconductor device 10 may receive a command CMD, an address ADD, data DQ, a data strobe DQS, a clock signal CLK, etc. from the external device 20, and may receive data on the basis of signals.

The semiconductor device 10 may include a plurality of memory banks, and may store data DQ in a specific bank selected from among a plurality of memory banks on the basis of a memory address signal ADD. In addition, the semiconductor device 10 may transmit data on the basis of the command CMD, the address ADD, the data strobe DQS, etc. received from the external 20, and may thus perform data transmission. The memory may transmit data stored in a specific region selected from among memory banks to the external device 20 on the basis of the address ADD, the data DQ, and the data strobe DQS.

The above-mentioned description has disclosed explanation of the embodiments. For reference, the embodiments may include additional structures for better understanding as necessary although the additional structures are not directly associated with technical ideas of the present disclosure. In addition, the Active High or Active Low constructions for indicating deactivation states of a signal and circuit may be changed according to the embodiments. In order to implement the same function, a transistor structure may be modified as necessary. That is, the PMOS transistor and the NMOS transistor may be replaced with each other as necessary, and may be implemented using various transistors as necessary. The above-mentioned circuit modification may be very frequently generated, such that a very high number of cases may exist and associated modification can be easily appreciated by those skilled in the art, and as such a detailed description thereof will herein be omitted for convenience of description.

As is apparent from the above description, an embodiment of the present disclosure includes a first oscillation signal generation circuit to be used as a target for degradation detection and a second oscillation signal generation circuit to be used as a reference for degradation comparison of the first oscillation signal generation circuit, such that an embodiment can measure degradation of the semiconductor device simply by measuring the first oscillation signal and the second oscillation signal after completion of the burn-in test. As a result, an embodiment can reduce the entire test time, resulting in reduction of production costs of the semiconductor device.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. The scope of the disclosure should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
a voltage generation circuit configured to generate a test voltage having a ground voltage level in a burn-in test;
a first oscillation signal generation circuit configured to include a plurality of first inverters each having a first PMOS transistor and a first NMOS transistor, receive power-supply voltage through a first source terminal of the first PMOS transistor, and generate a first oscillation signal based on a first oscillation enable signal;
a second oscillation signal generation circuit configured to include a plurality of inverters each having a second PMOS transistor and a second NMOS transistor, receive the test voltage having a ground voltage level during the burn-in test through a second source terminal of the second PMOS transistor, and generate a second oscillation signal having a ground voltage level during the burn-in test based on a second oscillation enable signal; and
a degradation detection circuit configured to generate an oscillation count signal based on the first oscillation signal and the second oscillation signal,
wherein the degradation detection circuit includes:
a counter configured to generate the oscillation count signal having a plurality of bits by counting a combination signal of the first oscillation signal and the second oscillation signal,
wherein the first oscillation enable signal and the second oscillation enable signal are disabled during the burn-in test.

2. The semiconductor device according to claim 1, wherein the first oscillation signal generation circuit is configured to output a first oscillation signal being oscillated based on the first oscillation enable signal being enabled.

3. The semiconductor device according to claim 1, wherein the first oscillation signal generation circuit is configured to output a first oscillation signal having a fixed level based on the first oscillation enable signal being disabled.

4. The semiconductor device according to claim 1, wherein:
when a burn-in test signal is enabled, an odd inverter and an even inverter from among a plurality of inverters of the first oscillation signal generation circuit have opposite levels.

5. The semiconductor device according to claim 1, wherein:
when a burn-in test signal is enabled, the first oscillation signal generation circuit generates a first oscillation signal being oscillated.

6. The semiconductor device according to claim 1, wherein, when the first oscillation enable signal is enabled, the degradation detection circuit is configured to generate the oscillation count signal by counting the first oscillation signal for a predetermined period of time.

7. The semiconductor device according to claim 1, wherein, when the second oscillation enable signal is enabled, the degradation detection circuit is configured to generate the oscillation count signal by counting the second oscillation signal for a predetermined period of time.

8. The semiconductor device according to claim 1, wherein the degradation detection circuit further includes:
an output circuit configured to serialize the oscillation count signal, and output the serialized oscillation count signal.

9. The semiconductor device according to claim 8, wherein the output circuit is configured to output the oscillation count signal based on an oscillation output signal.

10. The semiconductor device according to claim 8, wherein the output circuit is configured to output the oscillation count signal through a data (DQ) terminal.

11. The semiconductor device according to claim 1, wherein:
the number of inverters contained in the first oscillation signal generation circuit is identical to the number of inverters contained in the second oscillation signal generation circuit.

12. The semiconductor device according to claim 1, wherein, when a burn-in test signal is enabled, degradation of the second oscillation signal generation circuit is less than degradation of the first oscillation signal generation circuit.

13. The semiconductor device according to claim 1, wherein the first oscillation signal is either fixed to a specific level or oscillating based on the first oscillation enable signal.

* * * * *